(12) United States Patent
Adan (10) Patent No.: US 6,452,232 B1
(45) Date of Patent: Sep. 17, 2002

(54) SEMICONDUCTOR DEVICE HAVING SOI STRUCTURE AND MANUFACTURING METHOD THEREOF

(75) Inventor: Alberto Oscar Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/451,843

(22) Filed: Dec. 1, 1999

(30) Foreign Application Priority Data

Dec. 3, 1998 (JP) .......................................... 10-344247

(51) Int. Cl.⁷ .............................................. H01L 27/01
(52) U.S. Cl. .......................... 257/347; 257/59; 257/61; 257/327; 257/333; 257/337; 257/338; 257/346; 257/347; 438/217; 438/276; 438/289; 438/291
(58) Field of Search .......................... 257/61, 327, 333, 257/337, 338, 346, 347, 59; 438/217, 276, 289, 291

(56) References Cited

U.S. PATENT DOCUMENTS

| | | | | |
|---|---|---|---|---|
| 5,208,473 A | * | 5/1993 | Komori et al. .............. 257/345 |
| 5,401,982 A | * | 3/1995 | King et al. .................... 257/59 |
| 5,478,761 A | * | 12/1995 | Komoru et al. ............... 437/34 |
| 5,982,002 A | * | 11/1999 | Takasu et al. .............. 257/347 |
| 5,998,840 A | * | 12/1999 | Kim ............................. 257/349 |
| 6,034,408 A | * | 3/2000 | Ghoshal .................... 257/467 |
| 6,043,535 A | * | 3/2000 | Houston .................... 257/345 |
| 6,107,126 A | * | 8/2000 | Wu ............................. 438/217 |
| 6,180,983 B1 | * | 1/2001 | Merrill ....................... 257/347 |
| 6,204,534 B1 | * | 3/2001 | Adan .......................... 257/347 |
| 6,210,998 B1 | * | 3/2001 | Son ............................. 438/162 |
| 6,215,155 B1 | * | 4/2001 | Wollesen .................... 257/351 |
| 6,229,179 B1 | * | 5/2001 | Song et al. ................. 257/350 |

FOREIGN PATENT DOCUMENTS

| JP | 9-36246 A | 2/1997 |
|---|---|---|
| JP | 9-246562 A | 9/1997 |

OTHER PUBLICATIONS

Assaderaghi, et al, "Dynamic Threshold–Voltage MOSFET (DTMOS) for Ultra–Low Voltage VLSI", IEEE Transactions on Election Devices, vol. 44, No. 3, Mar. 3, 1997, pp. 414–422.

* cited by examiner

Primary Examiner—Eddie Lee
Assistant Examiner—Edgardo Ortiz
(74) Attorney, Agent, or Firm—Nixon & Vanderhye P.C.

(57) ABSTRACT

A semiconductor device with a SOI structure comprises; a SOI substrate having a buried insulating film and a first conductivity type surface semiconductor layer on the buried insulating film; second conductivity type source and drain regions formed in the surface semiconductor layer; and a gate electrode formed over a first conductivity type channel region between the source and drain regions via a gate insulating film, wherein the source and drain regions are thinner than the surface semiconductor layer, and the channel region in the surface semiconductor layer has a first conductivity type high-concentration impurity diffusion region whose first conductivity type impurity concentration is higher than that in a surface of the channel region and which is adjacent to the buried insulating film.

10 Claims, 8 Drawing Sheets

Distance from Surface of Surface Semiconductor Layer

SEMICONDUCTOR DEVICE HAVING SOI STRUCTURE AND MANUFACTURING METHOD THEREOF

BACKGROUND OF THE INVENTION

1. Field of the Invention

The present invention relates to a semiconductor device having a SOI structure and a manufacturing method thereof. More particularly, it relates to a semiconductor device which is formed on a SOI substrate having a high-concentration impurity diffusion region and can be applied to an integrated circuit operated by a low voltage, and a manufacturing method thereof.

2. Description of the Related Art

In recent years, a low voltage operation has been realized in a CMOS circuit, and in order to have a sufficient operational margin for realizing such a low voltage operation (Vdd<1.5 V) of the CMOS circuit, the threshold voltage (Vth) of a MOSFET constituting the CMOS circuit needs to be reduced to about ¼ or less of a power supply voltage (Vdd).

However, when the threshold voltage is reduced, the OFF leakage current of the MOSFET exponentially increases according to the following formulas:

$$Idoff = Io \times 10^{-Vth/S}$$

$$Io \approx 2 \times 10^{-7} Amp/\mu m$$

$$S = \ln 10 \cdot \frac{dVgs}{d(\ln Ids)} = (\ln 10) \cdot \frac{kT}{q}\left(1 + \frac{Cd}{Cox}\right) \approx 90 \text{ mV/dec}$$

where Idoff is a drain current in an OFF state (Vg=0), Io is a drain current when Vg=Vth, S is a gradient of a subthreshold (S factor), Cd is a depletion layer capacitance, and Cox is a gate capacitance.

It is found from these formulas that there is a trade-off relationship between the operating voltage of a transistor and the standby current of an LSI. Therefore, a MOSFET having a low threshold voltage causes a large standby current, and hence is not practical for a low voltage-, low power consumption-, and battery-operated LSI, and the like.

As a method of solving a problem of a trade-off relationship between the low threshold voltage and the OFF leakage current, it is thought to be effective to control the threshold voltage of the MOSFET in an operational state and a standby state: that is, in the operational state of a transistor, in order to realize the low voltage operation of the MOSFET, the threshold voltage is set at a low value, and in the OFF state, in order to reduce the OFF leakage current, the threshold voltage is set at a high value.

In this connection, in the case where the MOSFET is formed on a SOI substrate, there are several advantages such as a complete dielectric isolation, a latch-up-free, and the like. In particular, in the case of the MOSFET with a fully depleted SOI structure, since the whole channel region of a surface semiconductor layer is thin enough to be fully depleted, the Cd becomes O and the S factor can be reduced to 60 mV/dec at room temperature. This can reduce the OFF current. It is clear, however, that the trade-off relationship of the low threshold voltage is only shifted to low voltage.

Figure 10:
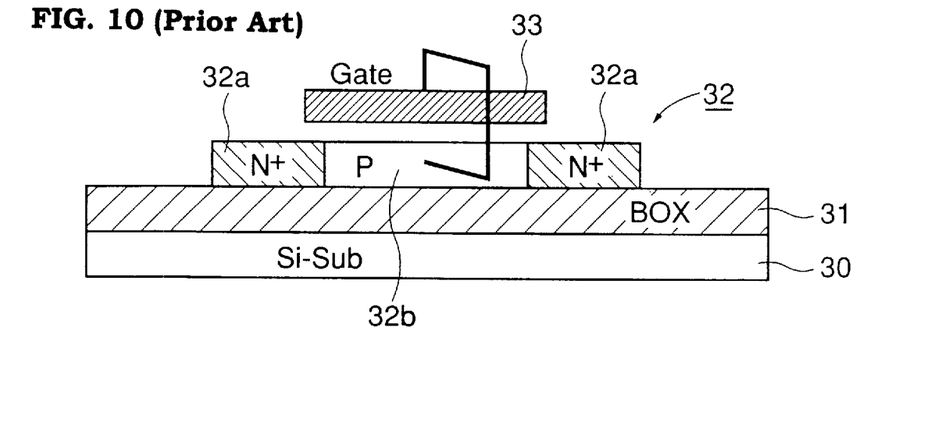
FIG. 10 is a schematic cross-sectional view of a main part showing a conventional semiconductor device with a SOI structure.

Also, as an alternative method of controlling the threshold voltage, for example, a dynamic threshold MOS (hereinafter referred to as DTMOS) formed on a substrate having a SOI structure is proposed in IEEE (Trans. On Electron Devices, vol 44, no.3, p414–422, March 1997). The DTMOS has a structure, as shown in FIG. 10, in which a buried insulating film 31 and a surface semiconductor layer 32 are formed on a silicon substrate 30 and in which a gate electrode 33, source/drain regions 32a, and a channel region 32b are formed on the surface semiconductor layer 32. Also, the gate electrode 33 is electrically connected to the channel region 32b. This structure makes it possible to apply a voltage to the channel region 32b directly and to control the threshold voltage of the channel.

However, in the DTMOS, each transistor needs an additional contact between the channel region 32b and the gate electrode 33 because the channel region 32b is required to be connected directly to the gate electrode 33. This causes a problem of increasing a layout area and complicating a manufacturing process. Additionally, this also causes a problem that the operating voltage Vdd needs to be much lower than the turn-on voltage (0.6 V) of a diode between the source and the substrate so as to avoid a leakage current, which restricts the application of the DTMOS.

Figure 11:
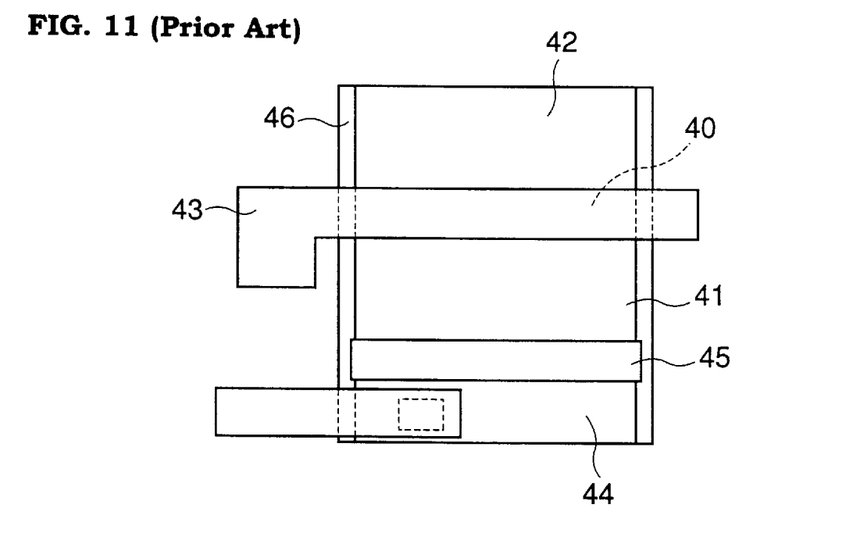
FIG. 11 is a schematic cross-sectional view of a main part showing another conventional semiconductor device with a SOI structure.

Further, another example is a MOS type semiconductor device having the SOI structure shown in FIG. 11, which is disclosed in Japanese Patent Laid-Open No. 9-246562. This semiconductor device has a structure in which a gate electrode 43, source and drain regions 41, 42, and a channel region 40 are formed on a surface semiconductor layer and in which there is provided a body contact region 44 adjacent to the source region 41 via a device isolating film 45 and a path 46 electrically connecting the channel region 40 to the body contact region 44. This structure makes it possible to apply a voltage to the channel region 40 directly and hence to control the threshold voltage of the channel.

However, this structure has a path 46 connecting the channel region 40 to the body contact region 44 in the region surrounding the transistor and hence presents a problem that it needs a larger design area for the semiconductor device.

Figure 12:
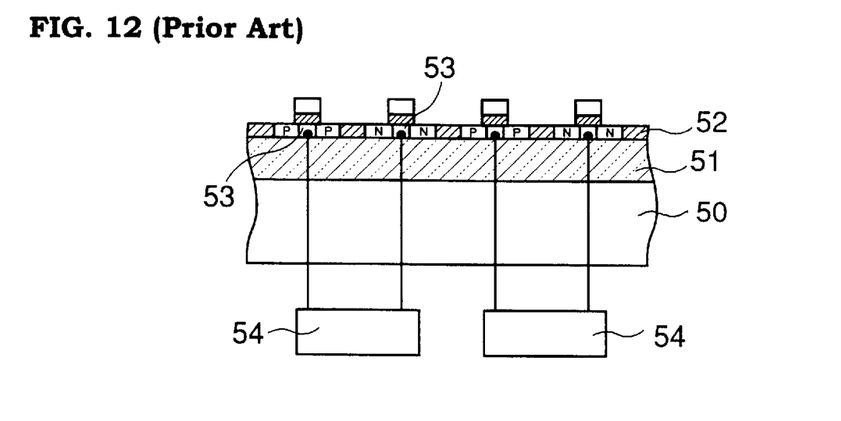
FIG. 12 is a schematic cross-sectional view of a main part showing still another conventional semiconductor device with a SOI structure.

Further, still another example is the semiconductor device shown in FIG. 12 which is disclosed in Japanese Patent Laid-Open No. 9-36246. In this semiconductor device, a buried insulating film 51 and a surface semiconductor layer 52 are formed on a silicon substrate 50 and a MOS transistor is formed on the surface semiconductor layer 52 and each channel region 53 of this MOS transistor is connected to a bias circuit 54, whereby voltage is directly applied to the channel region 53 to control the threshold voltage of the channel.

However, this semiconductor device presents a problem that it needs a larger layout area as is the case with the other semiconductor device described above because each transistor needs to be connected to the bias circuit.

SUMMARY OF THE INVENTION

In according with one aspect of the present invention, there is provided a semiconductor device with a SOI structure comprising; a SOI substrate having a buried insulating film and a first conductivity type surface semiconductor layer on the buried insulating film; second conductivity type source and drain regions formed in the surface semiconductor layer; and a gate electrode formed over a first conductivity type channel region between the source and drain regions via a gate insulating film, wherein the source and drain regions are thinner than the surface semiconductor layer, and the channel region in the surface semiconductor layer has a first conductivity type high-concentration impurity diffusion region whose first conductivity type impurity concentration is higher than that in a surface of the channel region and which is adjacent to the buried insulating film.

In according with another aspect of the present invention, there is provided a method of manufacturing a semiconductor device with a SOI structure, said method comprising the steps of: i) forming a buried insulating film and a first conductivity type surface semiconductor layer over a substrate and forming a gate insulating film and a gate electrode over the surface semiconductor layer; ii) implanting second conductivity type impurity ions by using the gate electrode as a mask to form second conductivity type source and drain regions; and iii) implanting second conductivity type impurity ions more deeply by using the gate electrode as a mask to reduce the first conductivity type impurity concentration of the first conductivity type surface semiconductor layer under the second conductivity type source and drain regions, thereby forming a first conductivity type high-concentration impurity diffusion region which is a first conductivity type channel region between the second conductivity type source and drain regions and is adjacent to the buried insulating film, and whose first conductivity type impurity concentration is higher than that in a surface of the channel region.

DESCRIPTION OF THE PREFERRED EMBODIMENTS

A semiconductor device with a SOI structure in accordance with the present invention has a SOI substrate having a buried insulating film and a first conductivity type surface semiconductor layer on the buried insulating film, second conductivity type source and drain regions which are thinner than the surface semiconductor layer, a first conductivity type channel region arranged between the source and drain regions and adjacent to the buried insulating film, and having a first conductivity type high-concentration impurity diffusion region whose impurity concentration is higher than that in a surface of the channel region, and a gate electrode formed on the first conductivity type channel region.

A SOI substrate in accordance with the present invention usually includes a support substrate, a buried insulating film formed on the support substrate and a surface semiconductor layer formed on the buried insulating film, and is effective in realizing a low power consumption and a high speed operation. Examples of the SOI substrate are a bonding SOI (BESOI) type substrate, a SIMOX (Separation by Implantation of Oxygen) type substrate, or the like. Various kinds of substrates can be used as the support substrate: for example, a semiconductor substrate such as silicon, germanium, or the like; a compound semiconductor such as GaAs, InGaAs, or the like; and an insulating substrate such as sapphire, quartz, glass, plastic, or the like. In this regard, a substrate in which a device or a circuit such as a transistor, a capacitor, or the like is formed on the support substrate described above may be used as the support substrate.

As the buried insulating film, for example, a $SiO_2$ film, a SiN film, or the like may be used. The thickness of the film may be adjusted in consideration of the characteristics of a semiconductor device to be realized, the magnitude of a voltage to be applied when the realized semiconductor device is used, and is, for example, about 50 nm to 500 nm.

The surface semiconductor layer is a semiconductor thin film functioning as an active layer for forming a transistor and may be formed of a thin film made of a semiconductor such as silicon, germanium, or the like, or a compound semiconductor such as GaAs, InGaAs, or the like. Among these materials, a silicon thin film is preferable. The thickness of the surface semiconductor layer can be adjusted in consideration of the characteristics of a semiconductor device to be realized, varying parameters, for example, the junction depth of the source and drain regions of a transistor described below, the depth of the channel region on the surface of the surface semiconductor layer, an impurity concentration, the depth of high-concentration impurity diffusion region adjacent to the buried insulating film, and the like, and is, for example, about 150 nm to 200 nm.

As described above, the surface semiconductor layer includes mainly 1) second conductivity type source and drain regions which are thinner than the surface semiconductor layer, 2) a channel region having a surface channel arranged between the source region and the drain region and a first conductivity type high-concentration impurity diffusion region which is arranged just under the surface channel and is adjacent to the buried insulating film, and whose impurity concentration is higher than that in the surface channel, and 3) a low-concentration impurity diffusion region which is adjacent to the first conductivity type high-concentration impurity diffusion region and is arranged just under the second conductivity type source and drain regions and has a first conductivity type impurity concentration equal to or lower than the impurity concentration of the surface channel.

1) The second conductivity type source and drain regions can be formed in such a way that they contain the impurities of the conductivity type equal to and reverse to the surface semiconductor layer, for example, in a concentration of about $1\times10^{20}$ atoms/cm$^3$ to $1\times10^{21}$ atoms/cm$^3$. In this connection, the source and drain regions may have, at the ends of the source and drain regions of the channel side, the regions which have structures like an LDD structure and whose impurity concentrations are lower than those of the source and drain regions, or the regions whose impurity concentrations are equal to or higher than those of the source and drain regions and which are slightly shallower than the junctions of the source and drain regions. Also, the depths of the source and drain regions can suitably be adjusted according to the characteristics of the semiconductor device to be produced and can be about 50% of the film thickness of the surface semiconductor layer (for example, 200 nm), to be more specific, 80 nm to 150 nm, in particular, 100 nm to 150 nm.

Figure 2:
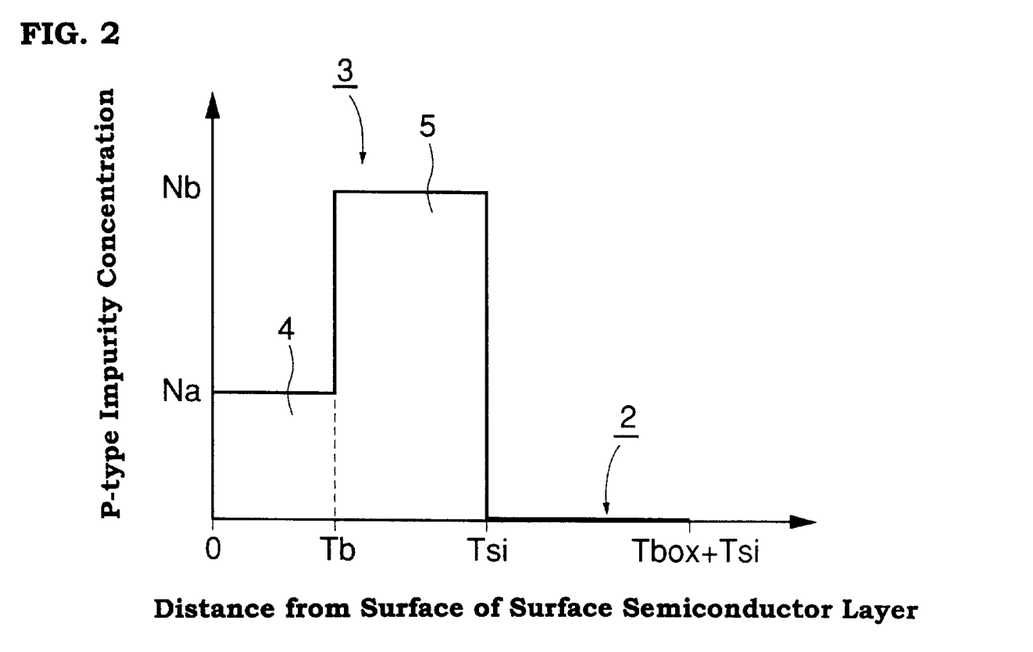
FIG. 2 is an illustration showing the profile of impurity concentration in the direction of the depth of the channel region of the semiconductor device in FIG. 1.

2) The channel region has a doping profile in which an impurity concentration varies abruptly in the surface channel and in the high-concentration impurity diffusion region in the direction of the depth of the channel region, as shown in FIG. 2. That is, if we set the first conductivity type impurity concentration of the surface channel at Na and the first conductivity type impurity concentration of the high-concentration impurity diffusion region adjacent to the buried insulating film at Nb, the impurity concentrations are set such that they satisfy a relationship of Nb>>Na. These impurity concentrations can be adjusted according to the film thickness of the surface semiconductor layer, the thickness of the surface channel, the thickness of the high-concentration impurity diffusion region, and the like, and for example, the second conductivity type impurity concentration of the surface channel Na is set at about $1\times10^{15}$ atoms/cm$^3$ to $1\times10^{18}$ atoms/cm$^3$ and the first conductivity type impurity concentration of the high-concentration impurity diffusion region adjacent to the buried insulating film Nb is set at about $1\times10^{18}$ atoms/cm$^3$ to $1\times10^{20}$ atoms/cm$^3$. Also, the thickness of the surface channel and the thickness of the high-concentration impurity diffusion region can suitably be adjusted according to the thickness of the surface semiconductor layer and are set at, for example, about 30 nm to 150 nm and 50 nm to 150 nm, respectively. In this respect, it is recommended that the thickness and the impurity concentration of the surface channel be set such that they satisfy the following:

$$Tb < \sqrt{\frac{4\cdot\varepsilon\cdot\phi_F}{q\cdot Na}}$$

where Tb is the thickness of the surface channel, $\varepsilon$ is the permittivity of the semiconductor constituting the surface semiconductor, $\phi_F$ is Fermi potential, and q is the amount of a unit electron charge, because the surface channel 4 of the semiconductor device in accordance with the present invention is fully depleted.

Also, it is preferable that the thickness and the impurity concentration of the high-concentration impurity diffusion region be set such that they satisfy the following formula:

$$Xd < \sqrt{\frac{4\cdot\varepsilon\cdot Vbi}{q\cdot Nb}}$$

where Xd is the thickness of the high-concentration impurity diffusion region and Vbi is a built-in voltage. In this respect, the high-concentration impurity diffusion region may be formed as a well formed in the surface semiconductor layer.

Figure 1:
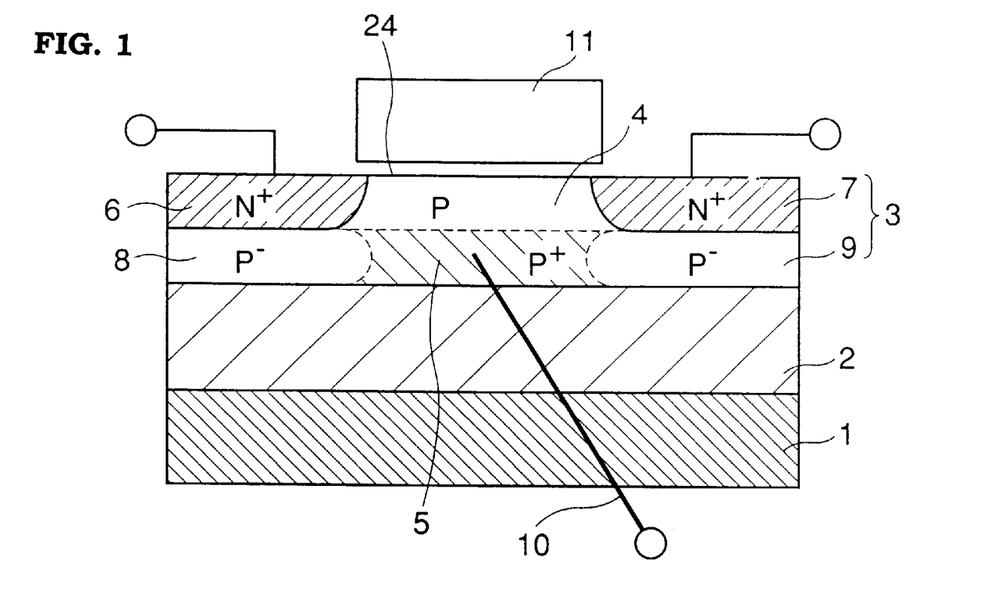
FIG. 1 is a schematic cross-sectional view of a main part showing a preferred embodiment of a semiconductor device with a SOI structure in accordance with the present invention.

Further, in this case, the threshold voltage Vth of the semiconductor device with a SOI structure in accordance with the present invention is expressed by the following formula:

$$Vth = Vfb + 2\cdot\phi_F \cdot\left(1 + \frac{Cb}{Cox}\right) + \frac{q\cdot Na\cdot Tb}{2\cdot Cox} - \left(\frac{Cb}{Cox}\right)\cdot Vb$$

where Vfb is a flat-band voltage, Cb is expressed by $\varepsilon/Tb$, Cox is the capacitance of a gate insulating film, and Vb is a voltage applied to a body region (region 5 in FIG. 1). According to the formula, the threshold voltage Vth varies linearly with the voltage Vb applied to the body region and hence it is found that the threshold voltage Vth can easily be controlled by the voltage Vb applied to the body region.

3) It is preferable that the first conductivity type impurity concentration of the first conductivity type low-concentration impurity diffusion region arranged under the source and drain regions be set in such a way to reduce the junction capacitances of the source and drain regions, for example, at a level equal to, more preferably, lower than that of the surface channel, and to be more specific, at about $1\times10^{15}$ atoms/cm$^3$ to $1\times10^{17}$ atoms/cm$^3$, and that the thickness of the first conductivity type high-concentration impurity diffusion region adjacent to the buried insulating film be set at 50 nm to 150 nm. Also, the low-concentration impurity diffusion region means the state of full depletion of the layer, that is, the state in which the whole region under the source and drain regions from the junction surface of the source and drain regions to an interface between the surface semiconductor layer and the buried insulating film is fully depleted.

Since a capacitance owing to a depleted layer expanding under the source and drain regions is connected in series to the capacitance of the buried insulating film by controlling the low-concentration impurity diffusion region to a full-depleted state, a source/drain junction capacitance, that is, a transistor load capacitance can be reduced, which leads to a reduction in the power consumption and to the speedup of the semiconductor device.

Also, the semiconductor device with a SOI structure in accordance with the present invention has a transistor including the source and drain regions formed on the surface semiconductor layer, the gate insulating film and the gate electrode formed on the channel region. The gate insulating film can usually be formed of material and in a film thickness functioning as a gate insulating film. The gate electrode can be formed of polysilicon; silicide of a metal having a high melting point such as W, Ta, Ti, Mo or the like; polycide made of the silicide (for example, $MoSi_2$, $WSi_2$) and polysilicon; and the other metals, in a film thickness of about 150 nm to 300 nm. In this respect, the gate electrode may have a side wall spacer made of an insulating film in consideration of the diffusion of the impurities in the lateral direction to form the source and drain regions described below.

In this regard, in the case where the above described high-concentration impurity diffusion region is formed as a well, it is preferable that a plurality of transistors are formed in the well and each transistor is isolated by a LOCOS oxide film or a trench device isolation film. Preferably, the thickness of the LOCOS oxide film or the trench device isolation film is thinner than the thickness of the surface semiconductor layer. This expands a high-concentration impurity diffusion region under the LOCOS oxide film or the trench device isolation film and the high-concentration impurity diffusion region can electrically connect the channel regions of the neighboring semiconductor devices. In this respect, the high-concentration impurity diffusion region expanding under the LOCOS oxide film or the trench device isolation film can suitably be adjusted according to the size, operating voltage, or the like of the semiconductor device, and the thickness and the impurity concentration thereof are important for controlling the voltage applied to the high-concentration impurity diffusion region under the surface channel and the threshold voltage of the semiconductor device, that is, the MOSFET. For example, in the case of a surface semiconductor layer having a thickness of about 150 nm to 200 nm, the thickness of the device isolating film can be about 50 nm to 150 nm and the impurity concentration of the high-concentration impurity diffusion region can be similar to that of the high-concentration impurity diffusion region under the surface channel. Also, a plurality of channel regions connected to each other can be connected to a power source at one position, whereby the threshold voltage of the channel region can be controlled and electric characteristics can be adjusted or varied. In this respect, as a method of controlling the threshold voltage of the channel region, there are, for example, the method in which when a transistor is active (ON), a bias voltage is applied thereto and when the transistor is standby (OFF), it is in a floating state, and the method in which when the transistor is ON, it is in a floating state and when the transistor is OFF, a bias voltage is applied thereto. This can reduce the absolute value of the threshold voltage to increase a driving force when the transistor is ON, and can reduce a leakage current or a consumption current when the transistor is OFF.

When a semiconductor device with a SOI structure in accordance with the present invention is formed, first, a buried insulating film and a first conductivity type surface semiconductor layer are formed on a substrate in a step i). A well-known method, for example, a CVD method using a silane gas and an oxygen gas can be used as a method of forming the buried insulating film on the substrate.

The first conductivity type surface semiconductor layer can be formed in a desired film thickness according to a method of forming a semiconductor layer which is well known in the related art.

Also, a method of making a first conductivity type surface semiconductor layer of a surface semiconductor layer is not restricted to a particular method, but the following methods may be used: a method of forming a surface semiconductor layer while doping it with first conductivity type impurities; or a method of forming a surface semiconductor layer and then implanting first conductivity type impurities into the surface semiconductor layer to dope the surface semiconductor layer with the impurities. In the case where the first conductivity type impurity is a P-type impurity, boron, $BF_2$, aluminum, gallium, indium, or the like is used, and gallium or indium is preferably used because it has a low diffuison coefficient and can correctly control diffusion. On the other hand, in the case where the first conductivity type impurity is an N-type impurity, phosphorus or arsenic is used. In this respect, in the case where the surface semiconductor layer is doped with the first conductivity type impurities, the whole surface semiconductor layer may be doped in a uniform impurity concentration with the first conductivity type impurities, or the surface semiconductor layer may be doped with the first conductivity type impurities in such a way that the impurity concentration is lower in the surface thereof than in the other part thereof, or the whole surface semiconductor layer may be doped in a uniform impurity concentration with the first conductivity type impurities and then may be doped with second conductivity type impurities to reduce the first conductivity type impurity concentration.

In the case where the whole surface semiconductor layer is doped in a uniform impurity concentration with the first conductivity type impurities, it is preferable that the concentration of the first conductivity type impurity is about $1 \times 10^{18}$ atoms/$cm^3$ to $1 \times 10^{20}$ atoms/$cm^3$. On the other hand, in the case where the impurity concentration is lowered in the surface thereof, it is preferable that the concentration of the first conductivity type impurity in the surface thereof is about $1 \times 10^{15}$ atoms/$cm^3$ to $1 \times 10^{18}$ atoms/$cm^3$.

Next, a gate insulating film and a gate electrode are formed on the surface semiconductor layer. The gate insulating film and the gate electrode can be formed according to a method of forming an ordinary MOS transistor.

In a step ii), second conductivity type impurity ions are implanted by using the gate electrode as a mask to form second conductivity type source and drain regions. The type of the second conductivity type impurity may be an N-type or a P-type and the above described impurities may be used. The depths of the source and drain regions can be adjusted according to the film thickness of the surface semiconductor layer, and in the case of the surface semiconductor layer having a thickness of 150 nm to 200 nm, the depth is preferably about 100 nm to 150 nm. For example, in the case where phosphorus is used, the method is used in which phosphorus ions are implanted at an acceleration energy of about 10 keV to 25 keV and at a dose of about $1 \times 10^{15}$ atoms/$cm^2$ to $4 \times 10^{15}$ atoms/$cm^2$, there by finally making an impurity concentration of about $1 \times 10^{20}$ atoms/$cm^3$ to $1 \times 10^{21}$ atoms/$cm^3$. Also, in the case where arsenic is used, the method is used in which arsenic ions are implanted at an acceleration energy of about 20 keV to 50 keV and at a dose of about $1 \times 10^{15}$ atoms/$cm^2$ to $4 \times 10^{15}$ atoms/$cm^2$. In this connection, the source and drain regions may be formed in a structure having an LDD region or a DDD region.

In a step iii), second conductivity type impurity ions are implanted more deeply by using the gate electrode as a mask. This can reduce the first conductivity type impurity concentration of the first conductivity type surface semiconductor layer under the second conductivity type source and drain regions, and results in forming the first conductivity type high-concentration impurity diffusion region which is a first conductivity type channel region between the second conductivity type source and drain regions and which is adjacent to the buried insulating film, and whose first conductivity type impurity concentration is higher than that in a surface of the channel region. For example, in the case where the surface semiconductor layer is formed of polysilicon having a thickness of about 150 nm to 200 nm and the gate electrode is formed of polysilicon having a thickness of 200 nm, the ion implantation of the second conductivity type impurity is performed at an acceleration energy of about 150 keV to 170 keV and at a dose of about $1 \times 10^{13}$ atoms/$cm^2$ to $5 \times 10^{14}$ atoms/$cm^2$ by using phsphorus, thereby finally making a first conductivity type impurity concentration of about $1 \times 10^{15}$ atoms/$cm^3$ to $1 \times 10^{17}$ atoms/$cm^3$. In the case where arsenic is used, the ion implantation is performed at an acceleration energy of about 320 keV to 380 keV and at a dose of about $1 \times 10^{13}$ atoms/$cm^2$ to $5 \times 10^{14}$ atoms/$cm^2$.

In this respect, in the case where the first conductivity type impurity concentration is not made lower in the surface of the surface semiconductor layer than that at the adjacent to the buried insulating film before the gate insulating film and the gate electrode are formed in the step i), it is preferable to select the kind of ion and the acceleration energy thereof in the ion implantation of the second conductivity type impurity in the step iii) such that the ions pass through the gate insulating film and the gate electrode and reach the surface of the surface semiconductor layer in the region where the gate electrode is formed, and in addition, to adjust the film thicknesses of the gate electrode and the gate insulating film. On the other hand, in the region where the gate electrode is not formed, the implanted impurity ions pass through the source and drain regions and reach the surface semiconductor layer between the source and drain regions and the buried insulating film, thereby reducing the first conductivity type impurity concentration of the surface semiconductor layer under the source and drain regions.

The preferred embodiments of a semiconductor device with a SOI structure in accordance with the present invention will hereinafter described with reference to the drawings.

Embodiment 1

FIG. 1 shows an NMOSFET with a SOI structure. In FIG. 1, a buried insulating film 2 and a surface silicon layer 3 are laminated on a silicon substrate 1, that is, a SOI structure substrate is used. N-type source and drain regions 6, 7 thinner than a surface silicon layer 3 are formed in the surface of the surface silicon layer 3 of the SOI structure substrate. A P-type surface channel 4 is arranged in the surface of the surface silicon layer 3 and between the source and drain regions 6, 7. Also, P-type low-concentration impurity diffusion regions 8, 9 whose impurity concentrations are lower than that of the surface channel 4 are formed in the surface silicon layer 3 under the source and drain regions 6, 7. Further, a P-type high-concentration impurity diffusion region 5 whose impurity concentration is higher than that of the surface channel 4 is formed under the P-type surface channel 4 and between the low-concentration impurity diffusion regions 8, 9. The profile of the impurity concentration is shown in FIG. 2. The high-concentration impurity diffusion region 5 is connected to an external voltage 10. Still further, a gate electrode 11 is formed on the surface channel 4 via a gate insulating film 24.

In this connection, while one NMOSFET has been described above, as shown in FIG. 3, a CMOSFET may be used.

Figure 3:
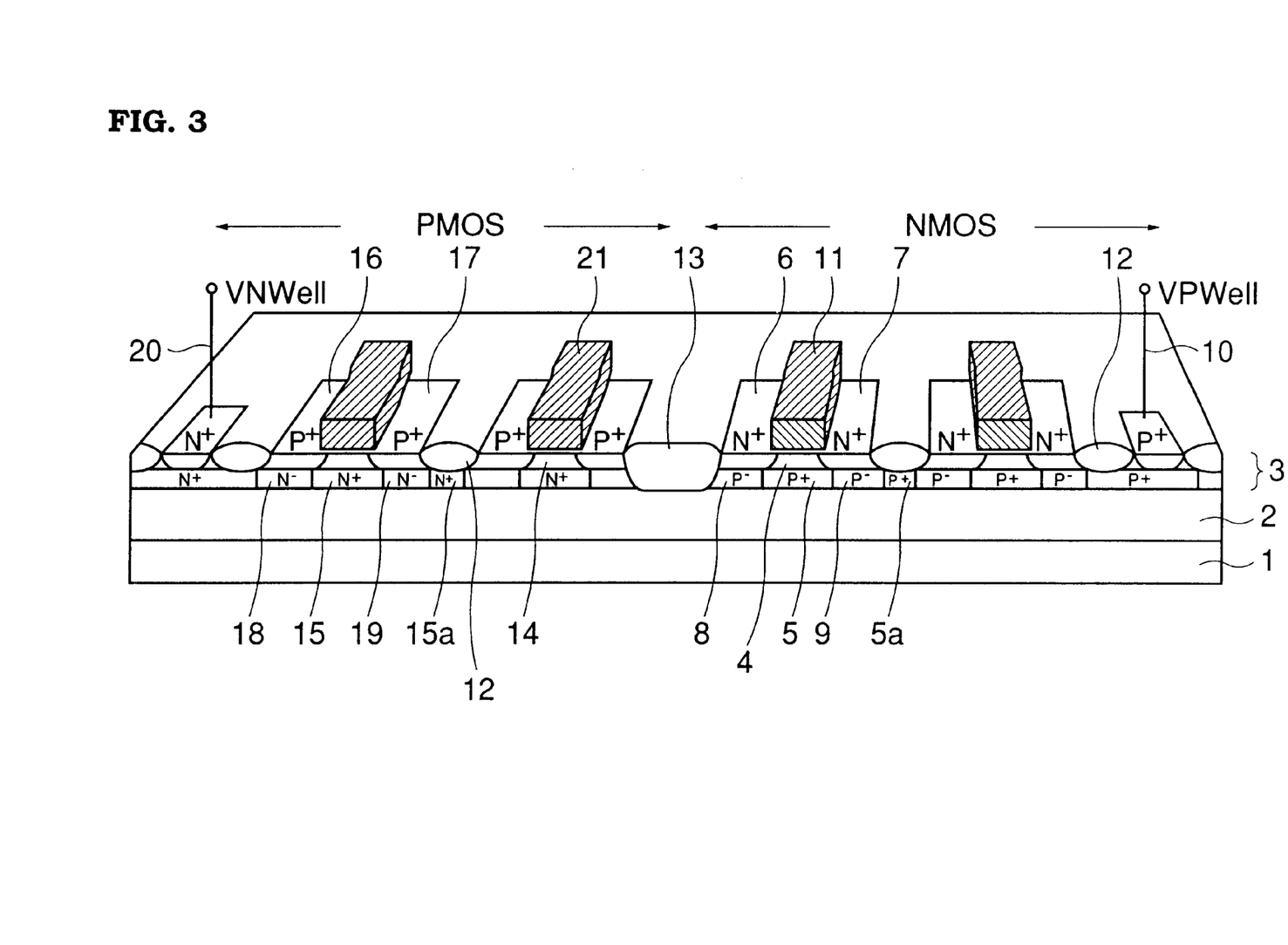
FIG. 3 is a schematic cross-sectional view of a main part showing a preferred embodiment in the case where a semiconductor device with a SOI structure in accordance with the present invention constitutes a CMOS.

In the CMOSFET shown in FIG. 3, an isolation region 13 which is thicker than the surface silicon layer 3 and reaches a buried insulating film 2 is formed in the surface silicon layer 3 to isolate an NMOS region from a PMOS region. The isolation region 13 can prevent an interference between the NMOS and the PMOS (for example, a latch-up).

Also, device isolating regions 12 thinner than the surface silicon layer 3 are formed in the NMOS region and in the PMOS region, respectively, and a plurality of NMOSFETs and a plurality of PMOSFETs isolated by these device isolating regions 12 are formed in the NMOS region and in the PMOS region, respectively.

The P-type high-concentration impurity diffusion regions 5 of a plurality of NMOSFETs are connected to each other by P-type high-concentration impurity diffusion regions 5a arranged under the device isolating regions 12 and are connected to an external voltage 10 at one position, and the N-type high-concentration impurity diffusion regions 15 of a plurality of PMOSFETs are connected to each other by N-type high-concentration impurity diffusion regions 15a arranged under the device isolating regions 12 and are connected to an external voltage 20 at one position.

The PMOSFET has the substantially same constitution as the NMOSFET described above except that it is different in conductivity type from the NMOSFET, that is, has P-type source and drain regions 16, 17, an N-type channel region 14, N-type low-concentration impurity diffusion regions 18, 19, an N-type high-concentration impurity diffusion region 15, a gate insulating film and a gate electrode 21, and is connected to an external voltage 20 as is the case with the NMOSFET.

The MOSFET having a constitution like this has the following advantages.

(a) The junction capacitances of the source and drain regions 6, 7, 16, 17 can be reduced by the full depletion of low-concentration impurity diffusion regions 8, 9, 18, 19.

(b) Since the surface silicon layer 3 may be thicker than the surface silicon layer with a fully depleted SOI structure, a process margin can be larger and hence the surface silicon layer 3 is easy to manufacture.

(c) Although a subthreshold swing is larger compared with a fully depleted SOI, a threshold voltage can be adjusted to reduce an OFF leakage current by controlling voltage applied to a channel body by external voltages 10, 20.

(d) The MOSFETs are connected to the external voltages 10, 20 by the high-concentration impurity diffusion regions 5, 15 and the high-concentration impurity diffusion regions 5, 15 can be formed as common well regions shared by a plurality of adjacent transistors. Therefore, this eliminates the need for providing an external area for applying a voltage to the substrate and hence can reduce the area of the MOSFET. Also, the layout of the transistors can be made comparable to that of a bulk CMOS.

(e) The high-concentration impurity diffusion regions 5, 15 under surface channels 4, 14 have very low resistances and hence can eliminate a RC delay and, for example, a transient phenomenon in the potential of the surface channels 4, 14 when a gate voltage is applied to them.

The characteristics of the above described MOSFET with a SOI structure will hereinafter be described. First, since the MOSFET with the SOI structure described above is not always fully depleted, the OFF current can not be reduced by reducing an S factor. However, the threshold voltage can be controlled by the high-concentration impurity diffusion region 5 in the surface silicon layer 3 when the MOSFET is turned on or off.

Figure 4:
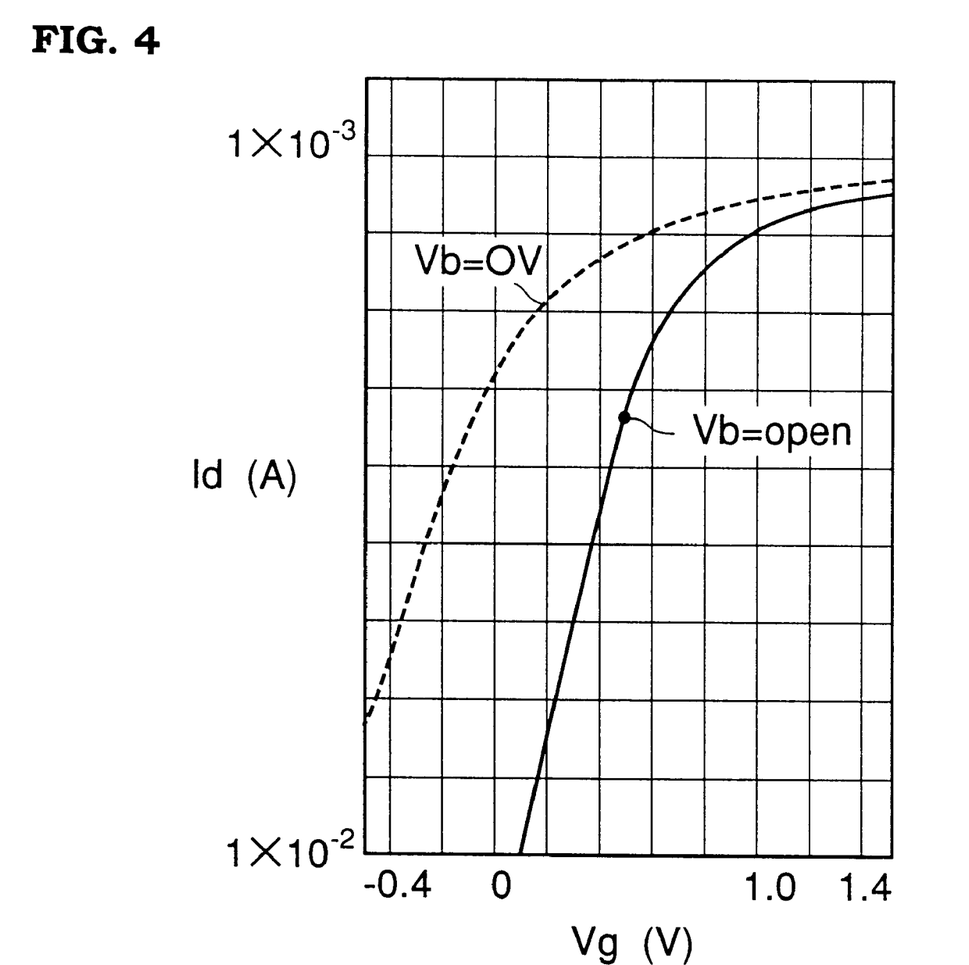
FIG. 4 is an illustration of an Id–Vg curve for explaining the characteristics of a semiconductor device with a SOI structure in accordance with the present invention.

That is, as shown in FIG. 4, according to the Ids–Vg characteristics of the MOSFET with the SOI structure described above, in the case where the W/L of the gate electrode is 2 $\mu$m/0.35 $\mu$m and Vds=0.6 V, when a voltage of Vb applied to the substrate is 0 V, a low threshold voltage can be produced and a high threshold voltage can be produced by opening a substrate contact. Therefore, for example, during an usual operation, the threshold voltage of the MOSFET is reduced to about 0.1 V or less by adjusting the voltage applied to the substrate to produce a high driving capability, and during an OFF state, the threshold voltage of the MOSFET is increased to about 0.6 V or more by adjusting the voltage applied to the substrate to reduce the OFF leakage current.

A well resistance Rw can be determined, as shown in FIG. 3, by suitably adjusting the concentration of a high-concentration region 5 under the gate and the concentration of the high-concentration region 5a under the device isolating film. Therefore, the well resistance Rw is determined in consideration of the effect of a substrate current and an AC transient phenomenon as described below.

Figure 5A:
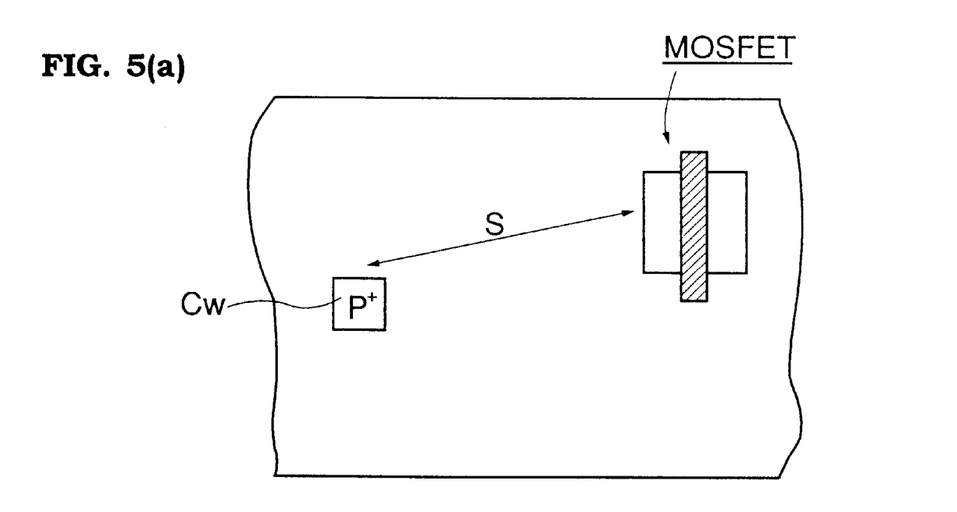
FIG. 5(a), FIG. 5(b) and FIG. 5(c) are a plan view, a cross-sectional view, and a circuit, respectively, of a MOSFET for explaining the characteristics of a semiconductor device with a SOI structure in accordance with the present invention.
Figure 5B:
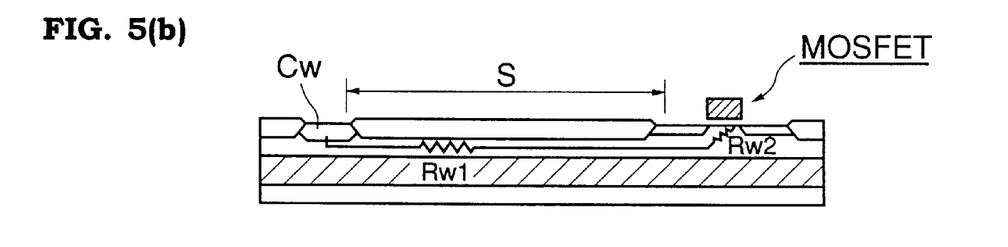
Figure 5C:
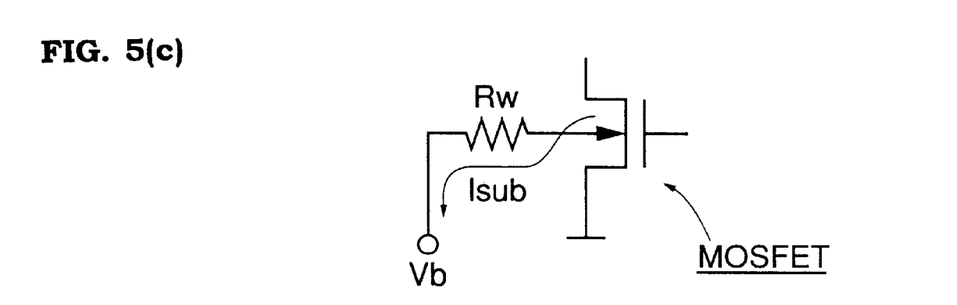

In general, in the case where a MOSFET formed in a well is a distance S away from a well contact Cw, as shown in FIG. 5(a), the well resistance Rw needs to be fully reduced as shown in the following formula to avoid from being a forward bias in a source junction owing to an ohmic voltage drop caused by a substrate current Isub, as shown in FIG. 5(b) and FIG. 5(c).

$$Vb + Rw \cdot I\,sub < Vjon \approx 0.6\ V$$

Figure 6:
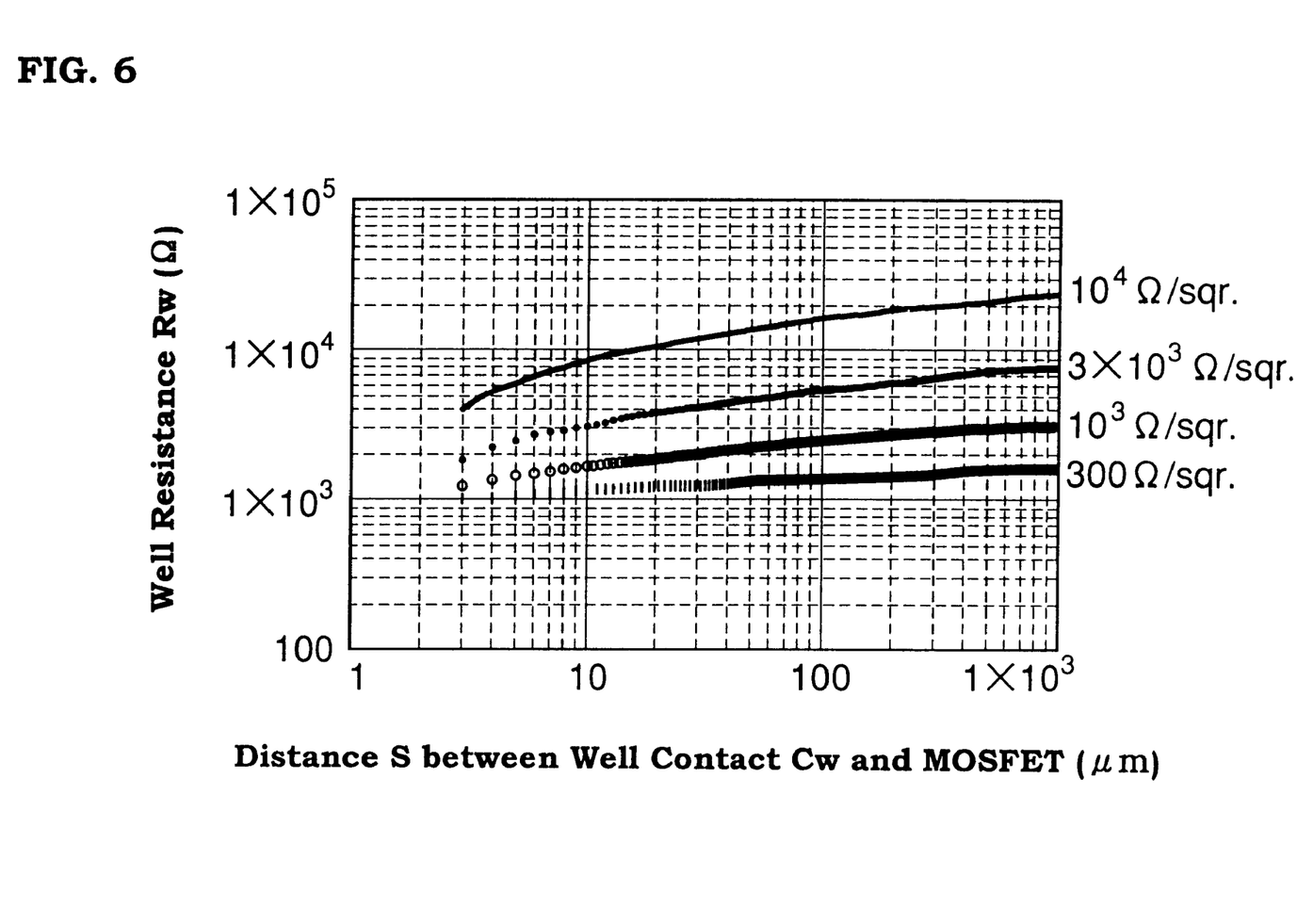
FIG. 6 is an illustration showing a relationship between a well resistance and a distance between a well contact and a MOSFET for explaining the characteristics of a semiconductor device with a SOI structure in accordance with the present invention.

The well resistance Rw depends on the layout and the resistivity of the well. FIG. 6 shows a relationship between the well resistance Rw and a distance S between the MOSFET and a well contact when the sheet resistance of the well is varied to 300 Ω/sqr., $10^3$ Ω/sqr., $3 \times 10^3$ Ω/sqr., $10^4$ Ω/sqr. In this connection, in the case where this MOSFET is operated by a low voltage (Vdd: less than 1V), the substrate current Isub of the MOSFET is very low, that is, not more than about 10 nA/μm and hence the substrate current Isub of the MOSFET having a gate width of 10 μm is not more than about 100 nA and the well resistance Rw of the MOSFET is not more than $10^6$ Ω. Therefore, the MOSFET may be adequately applicable to a device of the type operated by a low voltage in which the sheet resistance of the well is not more than about 2000 Ω/sqr.

Further, in order to produce an AC transient effect relating to a well contact, a low well resistance Rw and a low well capacitance Cw are required. This condition is expressed by the following formula:

$$\tau_w = \frac{Rw \cdot Cw}{2} \ll tr$$

where tr is a signal rise time. For example, for a fast signal with a tr of about 50 psec or less, Rw·Cw<<100 psec. In a typical case where the well resistance Rw is about 2000 Ω or less and Cw<<5×10$^{-14}$ F, as a first order approximation is expressed by the following formula:

$$Rw \cdot Cw \approx \frac{\varepsilon_{ox} \cdot \rho_w}{Tbox} \cdot S^2 < 2 \cdot tr$$

These relations can be used as guidelines to design the well thickness and the well resistance. In general, for a high speed operation circuit, the Rw·Cw time constant imposes a more severe condition on the design of the well contact.

A method of manufacturing the NMOSFET shown in FIG. 1 will be described below.

Figure 7A:
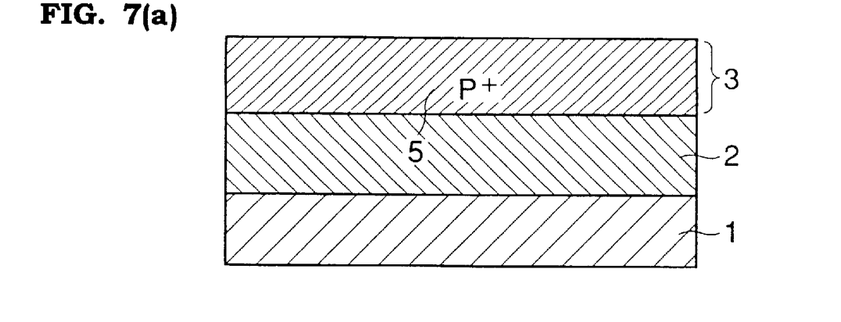
FIG. 7(a) to 7(c) are schematic cross-sectional views of a main part for explaining the manufacturing process of a semiconductor device with a SOI structure in accordance with the present invention.

First, as shown in FIG. 7(a), a SOI substrate is prepared in which a buried insulating film 2 made of $S_iO_2$ having a thickness of 50 nm to 500 nm and a surface silicon layer 3 having a thickness of about 150 nm to 200 nm are laminated on a silicon substrate 1. In this respect, a device isolating region (not shown) which is thicker than the surface silicon layer 3 and isolates each NMOSFET is formed on the surface silicon layer 3 by a LOCOS method, a trench method, or the like.

Then, for example, boron ions are implanted into the surface silicon layer 3 at an acceleration energy of 30 KeV and at a dose of $2 \times 10^{14}$ atoms/cm$^2$ and then are annealed at 900° C. for 60 minutes to form a P-type high-concentration impurity diffusion region 5 having a boron ion concentration of $10^{19}$ atoms/cm$^3$ or more. The high-concentration impurity diffusion region 5 is required to make a transistor have low wiring resistance and low contact resistance.

Figure 7B:
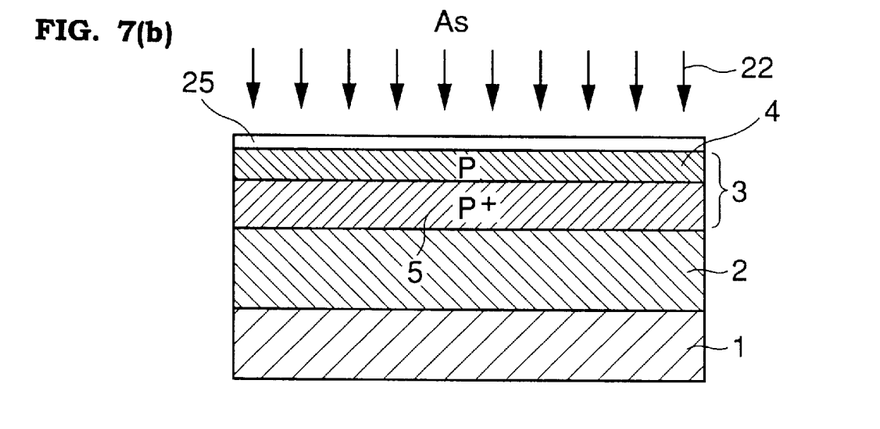

Then, as shown in FIG. 7(b), an oxide film 25 having a thickness of 10 nm is formed on the surface silicon layer 3, and As ions 22 are implanted into the surface silicon layer 3 through the oxide film 25 at an acceleration energy of 20 KeV and at a dose of $1 \times 10^{14}$ atoms/cm$^2$. The As ions 22 cancel part of the impurities in the surface of the high-concentration impurity diffusion region 5 to form a P-type surface channel 4 having an impurity concentration of about $1 \times 10^{16}$ atoms/cm$^3$ to $1 \times 10^{17}$ atoms/cm$^3$. This can produce a device having a threshold voltage of 0.1 V for a low voltage operation (ON state).

Figure 7C:
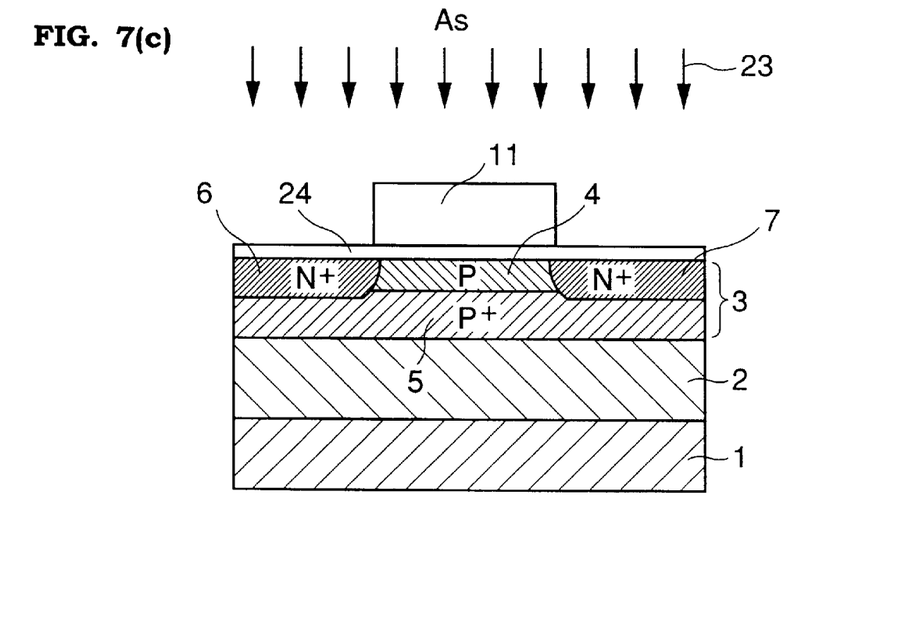

Then, as shown in FIG. 7(c), a gate insulating film 24 is formed on the surface silicon layer 3. The thickness of the gate insulating film 24 is about 4 nm to 8 nm for a device having a channel length of sub-half micron meter. A polysilicon film having a thickness of about 200 nm is formed on the gate insulating film 24 and is patterned by a photolithography and etching technology to form a gate electrode 11. Then, As ions 23 are implanted into the surface silicon layer 3 by using the gate electrode 11 as a mask. The ion implantation is performed at an acceleration energy of 320 keV and at a dose of $1 \times 10^{14}$ atoms/cm$^2$ to cancel a part of the impurities near the junction of the source and drain regions 6, 7 and the buried insulating film 2, of the high-concentration impurity diffusion region 5, which results in forming a P-type low-concentration impurity diffusion regions 8, 9 having an impurity concentration of $1 \times 10^{15}$ atoms/cm$^3$ to $1 \times 10^{17}$ atoms/cm$^3$. Further phosphorus ions are implanted at an acceleration energy of 40 keV and at a dose of $4 \times 10^{15}$ atoms/cm$^2$ to cancel the impurities on the surface of the surface silicon layer 3, of the high-concentration impurity diffusion region 5, and to transform a conductivity type. This results in forming N-type source and drain regions 6, 7 having an impurity concentration of $1 \times 10^{20}$ atoms/cm$^3$ to $1 \times 10^{21}$ atoms/cm$^3$.

In this way, as shown in FIG. 1, P-type low-concentration impurity diffusion regions 8, 9 can be formed under the source and drain regions 6, 7.

In this respect, the above described process can be performed at the same time as the PMOSFET. Also, a channel body connection and a channel body contact are formed in the same way as an ordinary bulk CMOS process and they are connected by metal wirings to complete a semiconductor device.

Embodiment 2

Figure 8:
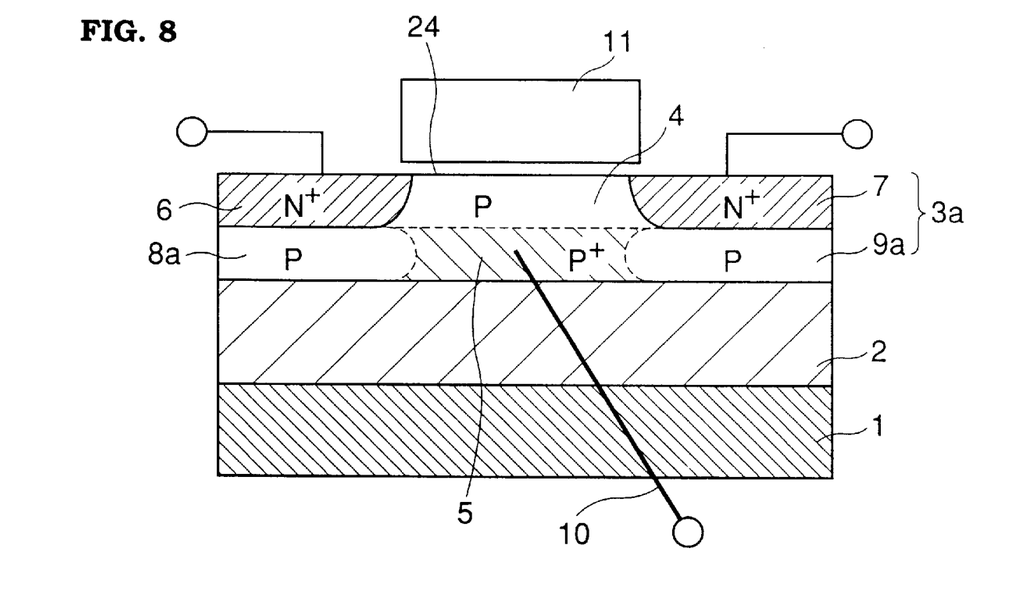
FIG. 8 is a schematic cross-sectional view of a main part showing another preferred embodiment of a semiconductor device with a SOI structure in accordance with the present invention.

An NMOSFET with a SOI structure of this preferred embodiment is the same as the NMOSFET with a SOI structure of the preferred embodiment 1 except that P-type impurity diffusion regions 8a, 9a having the same impurity concentration as the surface channel 4 are formed in the surface silicon layer 3a under the N-type source and drain regions 6, 7 as shown in FIG. 8.

A method of manufacturing the NMOSFET with the SOI structure shown in FIG. 8 will be described below. First, the same SOI substrate as the embodiment 1 is prepared and a P-type high-concentration impurity diffusion region 5 is formed in a surface silicon layer 3.

Figure 9:
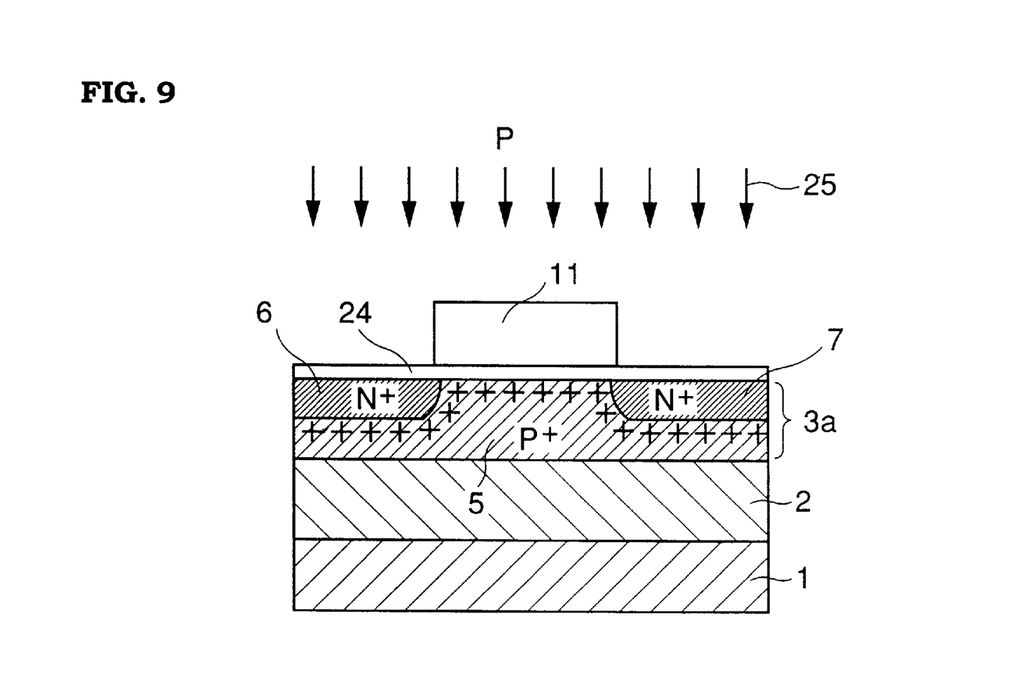
FIG. 9 is a schematic cross-sectional view of a main part for explaining the manufacturing process of the semiconductor device in FIG. 8.

Thereafter, as shown in FIG. 9, a gate insulating film 24 and a gate electrode 11 are formed on the surface of the surface silicon layer 3. Next, phosphorus ions 25 are implanted into a surface channel 4 under the gate electrode 11 and into the vicinity of the junction of the surface of the surface silicon layer 3 and a buried insulating film 2 at the same time by using the gate electrode II as a mask. The ion implantation is performed at an acceleration energy of 150 keV and at a dose of $1 \times 10^{14}$ atoms/cm$^2$ to cancel part of impurities in the surface channel 4 and in the vicinity of the junction of the surface silicon layer 3 and the buried insulating film 2, of the high-concentration impurity diffusion region 5, which results in forming a P-type surface channel 4 and impurity diffusion regions 8a, 9a having an impurity concentration of about $1 \times 10^{17}$ atoms/cm$^3$. Also, phosphorus ions are implanted at an acceleration energy of 40 keV and at a dose of $4 \times 10^{15}$ atoms/cm$^2$ to cancel the impurities of the surface of the surface silicon layer 3a, of the high-concentration impurity diffusion region 5, and to transform a conductivity type. This results in forming N-type source and drain regions 6, 7 having an impurity concentration of $1 \times 10^{20}$ atoms/cm$^3$ to $1 \times 10^{21}$ atoms/cm$^3$.

This can form P-type impurity diffusion regions 8a, 9a under the source and drain regions 6, 7 as is the case with the MOSFET with the SOI structure shown in FIG. 1 and can form the surface channel 4 having the same impurity concentration as the impurity diffusion regions 8a, 9a, while reducing the manufacturing steps more than the manufacturing method of the preferred embodiment 1.

A semiconductor device with a SOI structure in accordance with the present invention includes a SOI substrate made of a buried insulating film and a first conductivity type surface semiconductor layer which are laminated on a substrate, second conductivity type source and drain regions formed in the surface semiconductor layer, and a gate electrode formed on a first conductivity type channel region between the source region and the drain region via the gate insulating film. Since the source and drain regions are thinner than the surface semiconductor layer and the channel region has a first conductivity type high-concentration impurity diffusion region whose first conductivity type impurity concentration is higher than that in the surface of the channel region and which is adjacent to the buried insulating film, the high-concentration impurity diffusion region under the surface channel has a very low resistance and hence can remove a RC delay, and for example, the transient phenomenon of potential of the surface channels 4, 14 when a gate voltage is applied thereto. Further, according to the present invention, the surface semiconductor layer can be formed in a comparatively large thickness, which can make a process margin large and facilitate manufacturing the semiconductor device.

Also, in the case where the channel region is connected to a power source, a voltage applied to the channel region can be controlled by an external voltage. Therefore, in an ON state, the driving capability of the semiconductor device is improved to realize a low voltage operation, and in the OFF state, a threshold voltage can be adjusted to reduce an OFF leakage current.

Additionally, in the case where the surface semiconductor layer between the source and drain regions and the buried insulating film is fully depleted, the junction capacitances of the source and drain regions can be reduced.

Further, in the case where the channel region is connected to the other channel regions adjacent thereto via the high-concentration impurity diffusion region formed under a device isolating region and is connected to the power source at one point, there is no need for applying a voltage to the substrate to control potential or for specifically providing an external area to control the threshold voltage of the semiconductor device, which can reduce a layout area. Also, the design layout of the transistor can be the same as the bulk CMOS, which can more highly integrate the semiconductor device.

What is claimed is:

1. A semiconductor device with a SOI structure comprising:
   a SOI substrate having a buried insulating film and a first conductivity type surface semiconductor layer on the buried insulating film;
   second conductivity type source and drain regions formed in the surface semiconductor layer;
   a gate electrode formed over a first conductivity type channel region between the source and drain regions via a gate insulating film;
   impurity diffusion regions of the first conductivity type in the surface semiconductor layer below the source and drain regions;
   wherein the source and drain regions are thinner than the surface semiconductor layer, and the channel region in the surface semiconductor layer has a first conductivity type high-concentration impurity diffusion region whose first conductivity type impurity concentration is higher than that in a surface of the channel region and higher than that of the impurity diffusion regions, and wherein the high-concentration impurity diffusion region is adjacent to the buried insulating film.

2. A semiconductor device as claimed in claim 1, in which the first conductivity type high-concentration impurity diffusion region has an impurity concentration of $1 \times 10^{18}$ atoms/cm$^3$ to $1 \times 10^{20}$ atoms/cm$^3$ and the surface region of the channel region has an impurity concentration of $1 \times 10^{15}$ atoms/cm$^3$ to $1 \times 10^{18}$ atoms/cm$^3$.

3. A semiconductor device as claimed in claim 1, in which the channel region is connected to a power source to adjust or vary the characteristics of a transistor.

4. A semiconductor device as claimed in claim 1, in which, in an ON state, a bias voltage is applied to the channel region to reduce the absolute value of a threshold voltage, and in an OFF state, the channel region is set at a floating state to reduce a leakage current.

5. A semiconductor device as claimed in claim 1, in which, in an OFF state, a bias voltage is applied to the channel region to reduce the absolute value of a threshold current, and in an ON state, the channel region is set at a floating state to reduce the threshold voltage.

6. A semiconductor device as claimed in claim 1, in which a surface semiconductor layer between the source and drain regions and the buried insulating film is fully depleted.

7. A semiconductor device as claimed in claim 1, which constitutes a CMOS circuit.

8. A semiconductor device in which the channel region of the semiconductor device as claimed in claim 3 is connected to adjacent channel regions via a high-concentration impurity diffusion region formed under a device isolating region and is connected to a power source at one position.

9. A semiconductor device comprising:
   a SOI substrate including a buried insulating film, and a first conductivity type surface semiconductor layer on the buried insulating film;
   source and drain regions of a second conductivity type, formed in the surface semiconductor layer;
   a gate electrode formed over a first conductivity type channel region between the source and drain regions;
   at least one impurity diffusion region of the first conductivity type in the surface semiconductor layer below at least one of the source and drain regions;
   wherein the source and drain regions are thinner than the surface semiconductor layer, and the channel region in the surface semiconductor layer below the gate electrode includes both (a) a first conductivity type impurity diffusion region adjacent to the buried insulating film, and (b) a surface region at a surface of the channel; and
   wherein first conductivity type impurity concentration is higher in (a) than in both (b) and the at least one impurity diffusion region.

10. The semiconductor device of claim 1, wherein the first conductivity type high-concentration impurity diffusion region of the channel region does not contact the source or drain regions.

* * * * *